United States Patent
Moroz et al.

(10) Patent No.: US 9,786,734 B2
(45) Date of Patent: Oct. 10, 2017

(54) INTEGRATED CIRCUIT DEVICES HAVING FEATURES WITH REDUCED EDGE CURVATURE AND METHODS FOR MANUFACTURING THE SAME

(71) Applicant: SYNOPSYS, INC., Mountain View, CA (US)

(72) Inventors: Victor Moroz, Saratoga, CA (US); Lars Bomholt, Feusisberg (DK)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/748,091

(22) Filed: Jun. 23, 2015

(65) Prior Publication Data

US 2015/0295021 A1    Oct. 15, 2015

Related U.S. Application Data

(62) Division of application No. 13/190,319, filed on Jul. 25, 2011, now Pat. No. 9,064,808.

(51) Int. Cl.
*H01L 29/04* (2006.01)
*H01L 21/265* (2006.01)
*H01L 21/306* (2006.01)
*H01L 29/66* (2006.01)

(52) U.S. Cl.
CPC ...... *H01L 29/045* (2013.01); *H01L 21/26506* (2013.01); *H01L 21/30604* (2013.01); *H01L 29/04* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 3,765,969 A | 10/1973 | Kragness et al. |
| 4,882,294 A | 11/1989 | Christenson |
| 5,641,380 A | 6/1997 | Yamazaki et al. |
| 5,810,923 A | 9/1998 | Yano et al. |
| 6,137,136 A | 10/2000 | Yahata et al. |
| 6,376,339 B2 | 4/2002 | Linthicum et al. |
| 6,656,271 B2 | 12/2003 | Yonehara et al. |
| 6,960,781 B2 | 11/2005 | Currie et al. |

(Continued)

FOREIGN PATENT DOCUMENTS

| | | |
|---|---|---|
| CN | 102117737 A | 7/2011 |
| JP | 2007-324384 A | 12/2007 |

(Continued)

OTHER PUBLICATIONS

Martin-Bragado, I. et al., "Facet formation during Solid Phase Epitaxy Regrowth: A Lattice Kinetic Monte Carlo model," Nanoscale Science and Design, Appl. Phys. Lett. 95:12,123123, 2009, 3pp.

(Continued)

*Primary Examiner* — Khaja Ahmad
(74) *Attorney, Agent, or Firm* — Haynes Beffel & Wolfeld LLP

(57) ABSTRACT

A structure such as an integrated circuit device is described having a line of material with critical dimensions which vary within a distribution substantially less than that of a mask element, such as a patterned resist element, used in manufacturing the line of material.

10 Claims, 17 Drawing Sheets

(56) References Cited

U.S. PATENT DOCUMENTS

| | | |
|---|---|---|
| 7,029,977 B2 | 4/2006 | Kishimoto et al. |
| 7,038,249 B2 | 5/2006 | Suligoj et al. |
| 7,123,805 B2 | 10/2006 | Sparacin et al. |
| 7,326,969 B1 | 2/2008 | Horch |
| 7,335,908 B2 | 2/2008 | Samuelson et al. |
| 7,387,944 B2* | 6/2008 | Tong .................. H01L 21/0206 257/E21.122 |
| 7,411,274 B2 | 8/2008 | Yamanaka et al. |
| 7,459,363 B2 | 12/2008 | Subramanian |
| 7,540,970 B2 | 6/2009 | Koh et al. |
| 7,547,637 B2 | 6/2009 | Brask et al. |
| 7,788,818 B1 | 9/2010 | Tran et al. |
| 7,799,699 B2 | 9/2010 | Nuzzo et al. |
| 7,827,519 B2 | 11/2010 | Scheffer et al. |
| 7,831,123 B2 | 11/2010 | Sparacin et al. |
| 7,932,123 B2 | 4/2011 | Rogers et al. |
| 7,977,766 B2 | 7/2011 | Booth, Jr. et al. |
| 3,026,180 A1 | 9/2011 | Greeley et al. |
| 8,084,825 B2 | 12/2011 | Fuller et al. |
| 8,241,977 B2 | 8/2012 | Scheiper et al. |
| 8,455,159 B2 | 6/2013 | Ryu |
| 8,492,068 B2 | 7/2013 | Bae et al. |
| 8,545,710 B2 | 10/2013 | Kuboi et al. |
| 8,609,550 B2 | 12/2013 | Moroz et al. |
| 8,822,248 B2 | 9/2014 | Park |
| 9,064,808 B2 | 6/2015 | Moroz et al. |
| 9,152,750 B2 | 10/2015 | Moroz et al. |
| 9,379,183 B2 | 6/2016 | Moroz et al. |
| 2003/0047129 A1 | 3/2003 | Kawahara et al. |
| 2003/0094674 A1 | 5/2003 | Ipposhi et al. |
| 2003/0098292 A1* | 5/2003 | Kulkarni ................. C23F 4/00 216/78 |
| 2003/0177975 A1 | 9/2003 | Ikesue et al. |
| 2005/0067630 A1 | 3/2005 | Zhao |
| 2005/0116290 A1 | 6/2005 | de Souza et al. |
| 2005/0205859 A1 | 9/2005 | Currie et al. |
| 2006/0131553 A1 | 6/2006 | Yamanaka et al. |
| 2006/0228847 A1 | 10/2006 | Liu et al. |
| 2006/0267088 A1 | 11/2006 | Sharp et al. |
| 2007/0015371 A1* | 1/2007 | Olynick ............ H01L 21/30655 438/712 |
| 2007/0032089 A1 | 2/2007 | Nuzzo et al. |
| 2007/0099404 A1 | 5/2007 | Govindaraju et al. |
| 2007/0259467 A1 | 11/2007 | Tweet et al. |
| 2008/0108171 A1 | 5/2008 | Rogers et al. |
| 2008/0121882 A1 | 5/2008 | Hwang et al. |
| 2008/0163139 A1 | 7/2008 | Scheffer et al. |
| 2008/0182419 A1 | 7/2008 | Yasui et al. |
| 2008/0253728 A1 | 10/2008 | Sparacin et al. |
| 2008/0257409 A1 | 10/2008 | Li et al. |
| 2008/0267239 A1 | 10/2008 | Hall et al. |
| 2008/0305437 A1* | 12/2008 | Fuller ............... H01L 21/28123 430/319 |
| 2009/0011566 A1 | 1/2009 | Okada et al. |
| 2009/0017627 A1 | 1/2009 | Greeley et al. |
| 2009/0032873 A1* | 2/2009 | Cites .................. H01L 21/2007 257/347 |
| 2009/0309160 A1 | 12/2009 | Cohen et al. |
| 2010/0048027 A1* | 2/2010 | Cheng ............... H01L 21/30608 438/745 |
| 2010/0193860 A1 | 8/2010 | Scheiper et al. |
| 2010/0197088 A1 | 8/2010 | Sakuma et al. |
| 2010/0219505 A1* | 9/2010 | D'Evelyn ............... C30B 7/105 257/615 |
| 2011/0104875 A1* | 5/2011 | Wojtczak .......... H01L 21/30608 438/478 |
| 2011/0159699 A1 | 6/2011 | Gabriel |
| 2011/0291188 A1* | 12/2011 | Cheng .................. H01L 29/785 257/347 |
| 2012/0043623 A1 | 2/2012 | Doris et al. |
| 2012/0103939 A1* | 5/2012 | Wu .................. H01J 37/32192 216/70 |
| 2012/0202333 A1 | 8/2012 | Breitwisch et al. |
| 2013/0026607 A1 | 1/2013 | Moroz et al. |
| 2013/0037857 A1 | 2/2013 | Von Kanel et al. |
| 2014/0223394 A1 | 8/2014 | Moroz et al. |

FOREIGN PATENT DOCUMENTS

| | | |
|---|---|---|
| KR | 2005-0118435 A | 12/2005 |
| KR | 10-0843043 B1 | 7/2008 |
| KR | 2008-0114158 A | 12/2008 |
| KR | 1020080114158 | 12/2008 |
| KR | 10-0918864 B1 | 9/2009 |
| TW | 540117 B | 7/2003 |
| TW | 200836083 A | 9/2008 |
| TW | 200952040 A | 12/2009 |
| TW | 201020685 A | 6/2010 |
| TW | 201100946 A | 1/2011 |

OTHER PUBLICATIONS

Martin-Bragado, I. et al., "Modeling of {311} facets using a lattice kinetic Monte Carlo three-dimensional model for selective epitaxial growth of silicon," Nanoscale Science and Design, Appl. Phys. Lett. 98:15,153111, 2011, 3pp.

"Wet-Chemical Etching and Cleaning of Silicon," Technology Notes #7, VSI Technology Library, Virginia Semiconductor Inc., www.virginiasemi.com, 2003, 11pp.

Wada, H., "UV Nanoimprint Technology for sub-25nm Half-Pitch Semiconductor Device Manufacturing," Molecular Imprints 2010 Int'l Symp. Lithography Extensions, 20 slides.

U.S. Appl. No. 13/190,319—Office Action dated Jan. 17, 2013, 16 pages.

PCT/US12/47431—International Search Report dated Jan. 28, 2013, 10 pages.

PCT/US12/54224—International Search Report dated Mar. 4, 2013, 12 pages.

U.S. Appl. No. 13/190,319—Response B filed Apr. 17, 2013, 8 pages.

Mistry et al. "A 45nm Logic Technology with High-k+Metal Gate Transistors, Strained Silicon, 9 Cu Interconnect Layers, 193nm Dry Patterning, and 100% Pb-free Packaging," Electron Devices Meeting, IEDM 2007, IEEE International, Dec. 10-12, 2007, 4 pages.

Moroz et al., "Options At the 45nm Node Include Engineered Substrates," Solid State Technology, Jul. 2005, 4 pages.

U.S. Appl. No. 13/190,319—Office Action dated Jul. 17, 2014, 18 pages.

U.S. Appl. No. 14/201,584—Office Action dated Sep. 30, 2014, 13 pages.

TW 101132748—Office Action dated Oct. 21, 2014, 12 pages.

U.S. Appl. No. 14/201,584—Office Action dated Jan. 23, 2015, 8 pages.

TW 101126042—Office Action dated Jan. 29, 2015, 17 pages.

U.S. Appl. No. 13/190,319—Notice of Allowance dated Feb. 17, 2015, 20 pages.

U.S. Appl. No. 14/201,584—Notice of Allowance dated Jun. 2, 2015, 9 pages.

U.S. Appl. No. 13/350,523—Notice of Allowance dated Aug. 14, 2013, 18 pages.

U.S. Appl. No. 14/201,584—Response to Office Action dated Jan. 23, 2015, filed May 20, 2015, 9 pages.

U.S. Appl. No. 14/201,584—Response to Office Action dated Sep. 30, 2014, filed Dec. 29, 2014, 6 pages.

TW 101132748—Reponse to Office Action dated Oct. 21, 2014, filed Jan. 21, 2015, 40 pages.

U.S. Appl. No. 13/190,319—Response C to Final Office Action dated Jun. 19, 2013 filed Nov. 19, 2013, 10 pages.

U.S. Appl. No. 13/190,319—Response D to Office Action dated Jul. 17, 2014 filed Jan. 20, 2015, 26 pages.

TW 101126042—Response to Office Action dated Jan. 29, 2015 filed Apr. 28, 2015, 22 pages.

TW 101126042—Office Action dated Jun. 29, 2015, 12 pages.

EP 12829654—Supplemental Partial European Search Report dated Jul. 6, 2015, 2 pages.

(56) References Cited

OTHER PUBLICATIONS

Kalburge, A., et al. "Focused ion beam assisted chemically etched mesas on GaAs (001) and the nature of subsequent molecular beam epitaxial growth." Journal of applied physics 82.2, Jul. 15, 1997, pp. 859-864.
Wang, et al. "The morphology of InPInGaAs grown by molecular beam epitaxy onto V-grooved InP substrates." Journal of crystal growth 173.3 (1997), pp. 307-314.
Juan et al., "Controlling sidewall smoothness for micromachined Si mirrors and lenses." Journal of Vacuum Science & Technology B 14.6 (1996), pp. 4080-4084.
KR 2014-7008640—Office Action dated Jul. 20, 2015, 12 pages.
TW 101132748—Office Action dated Jul. 9, 2015, 4 pages.
TW 101126042—Response to Office Action dated Jun. 29, 2015 filed Aug. 31, 2015, 21 pages.
KR—2014-7008640—Response to Office Action dated Jul. 20, 2015 filed Sep. 21, 2015, 70 pages.
KR—2014-7008640—Office Action dated Jul. 20, 2015, 12 pages.
U.S. Appl. No. 14/869,733—Office Action dated Jan. 25, 2016, 16 pages.
CN 2012800477749—First Office Action dated Nov. 5, 2015, 20 pages.
EP 12829654.8—Search Report dated Jan. 28, 2016, 17 pages.
Nilsson D et al "Fabrication of silicon molds for polymer optics", Journal of Micromechanics & Microengineering, Instititue of Physics Publishing, Bristol, GB, vol. 13, No. 4, Jul. 1, 2003, pp. S57-S61.
Schuler H et al: "In situ etching and regrowth in III-V molecular beam epitaxy for future nanotechnology", Journal of Vacuum Science & Technology B: Microelectronicsprocessing and Phenomena, American Vacuum Society, NY, NY, US, vol. 18, No. 3, May 1, 2000, pp. 1557-1561.
Shikida M et al: "The mechanism of selective corrugation removal by KOH anisotropic wet etching", Journal of Micromechanics & Microengineering, Institute of Physics Publishing, Bristol, GB, vol. 20, No. 1, Jan. 1, 2010, p. 15038.
TW 101132748—Notice of Allowance dated Jan. 25, 2016, 2 pages.
KR 2014-7008640—Second Office Action (Final Rejection) dated Jan. 25, 2016, 8 pages.
U.S. Appl. No. 14/869,733—Response to Office Action dated Jan. 25, 2016 filed Feb. 3, 2016, 5 pages.
U.S. Appl. No. 14/869,733—Notice of Allowance dated Mar. 1, 2016, 10 pages.
KR 2014-7008640—Response to Second Office Action (Final Rejection) dated Jan. 25, 2016, 22 pages.
TW 101126042—Notice of Allowance dated Jun. 27, 2016, 2 pages.
CN 2012800477749—Second Office Action dated Jul. 12, 2016, 6 pages.
CN 2012800477749—Response to First Office Action dated Nov. 5, 2015 filed Mar. 21, 2016, 17 pages.
Yahata et al., "Smoothing of Si Trench Sidewall Surface by Chemical Dry Etching and Sacrificial Oxidation," Jpn. J. Appl. Phys. vol. 37, (1998), pp. 3954-3955.

U.S. Appl. No. 13/190,319—Final Office Action dated Jun. 19, 2013.
TW 101132748—Response to Office Action dated Jul. 9, 2015 filed Sep. 1, 2015, 29 pages.
TW 101132748—Office Action dated Jul. 9, 2015 with English translation, 4 pages.
Tezuka T et al: "Observation of Mobility Enhancement in Strained Si and SiGe Tri-Gate MOSFETS with Multi-Nanowire Channels Trimmed by Hydrogen Thermal Etching", 2007 IEEE Intl. Electron Devices Meeting: Washington, DC, Dec. 10-12, 2007, pp. 887-890.
CN 2012800477749—Response to Second Office Action dated Jul. 12, 2016 filed Sep. 20, 2016, 14 pages.
CN 2012800477749—Notice of Allowance dated Nov. 2, 2016, 2 pages.
TW 105105645—First Office Action dated Nov. 3, 2016, 6 pages.
U.S. Appl. No. 13/190,319—Advisory Action dated Nov. 29, 2013, 4 pages.
Yu et al., "Investigation of Nanowire Line-Edge Roughness in Gate-All-Around Silicon Nanowire MOSFETs," IEEE Transactions on Electron Devices, vol. 57, No. 11, Nov. 2010, 8 pages.
Soda et al., "Reduction effect of line edge roughness on time-dependent dielectric breakdown lifetime of Cu/low-k Interconnects by using CF3I etching," J. Vac. Sci. Technol. B 27(2), Mar./Apr. 2009, pp. 649-653.
Soda et al., "Mechanism of reducing line edge roughness in ArF photoresist by using CF3I plasma," J. Vac. Sci. Technol. B 27(5), Sep./Oct. 2009, pp. 2217-2123.
Naulleau et al., "System-level line-edge roughness limits in extreme ultraviolet lithography," J. Vac. Sci. Technol. B 26 (4), Jul./Aug. 2008, pp. 1289-1293.
Pargon et al., "Linewidth roughness transfer measured by critical dimension atomic force microscopy during plasma patterning of polysilicon gate transistors," J. Vac. Sci. Technol. B (26)3, May/Jun. 2008, pp. 1011-1020.
PCT/US12/47431—Written Opinion dated Jan. 28, 2013, 5 pages.
PCT/US12/47431—International Preliminary Report on Patentability dated Jan. 28, 2014, 6 pages.
PCT/US12/54224—International Preliminary Report on Patentability dated Mar. 12, 2014, 8 pages.
U.S. Appl. No. 15/192,651—Preliminary Amendment filed Nov. 9, 2016, 10 pages.
CN 2012800477749—Voluntary Amendment filed Sep. 22, 2014, 18 pages.
EP 12829654.8—Response to Search Report dated Jan. 28, 2016, filed Aug. 26, 2016, 18 pages.
TW 105105645—Response to First Office Action dated Nov. 3, 2016, filed Jan. 19, 2017, 7 pages.
KR 2014-7008640—Third Office Action (Appeal Decision) dated Dec. 26, 2016, 18 pages.
TW 105105645—Notice of Allowance dated Apr. 12, 2017, 2 pages.
Fried et al., "Comparison study of FinFETs: SOI vs. Bulk," SOI Industry Consortium, Press Release Oct. 21, 2009, 19 pages, http://www.soiconsortium.org/news-events/the-soi-industry-consortium-announces-results-of-a-soi-and-bulk-finfets-comparison-study-24.php.

* cited by examiner

INTEGRATED CIRCUIT DEVICES HAVING FEATURES WITH REDUCED EDGE CURVATURE AND METHODS FOR MANUFACTURING THE SAME

CROSS-REFERENCE TO RELATED APPLICATIONS

This application is a divisional of U.S. application Ser. No. 13/190,319, filed 25 Jul. 2011, entitled "INTEGRATED CIRCUIT DEVICES HAVING FEATURES WITH REDUCED EDGE CURVATURE AND METHODS FOR MANUFACTURING THE SAME," by Victor Moroz and Lars Bomholt and which application is incorporated herein by reference in its entirety.

BACKGROUND

Field of the Invention

The present invention relates to integrated circuit fabrication, and more particularly to methods for fabricating high-density integrated circuit devices.

Description of Related Art

Photolithographic processes can be used to form a variety of integrated circuit structures on a semiconductor wafer. In photolithography, features of these structures are typically created by exposing a mask pattern (or reticle) to project an image onto a wafer that is coated with light sensitive material such as photo resist. After exposure, the pattern formed in the photo resist may then be transferred to an underlying layer (e.g. metal, polysilicon, etc.) through etching to create the desired features.

One problem associated with manufacturing devices having very small features arises because of variations introduced by the photolithographic processes. Specifically, resist material properties, process conditions, optical distortions and other factors can cause systematic and random deviations in the etched shapes of the features from their desired shapes. Examples of deviations include corner-rounding, line-shortening and line edge roughness.

In a typical lithographic patterning process, a line of resist is used as an etch mask to create a corresponding line of material in the underlying layer. In such a case, the deviations in the patterned line of resist will be transferred to the critical dimensions of the line in the underlying layer. As process technologies continue to shrink, these deviations become a greater percentage of the critical dimension of the line of material, which can reduce yield and result in significant performance variability in devices such as transistors implemented utilizing these lines of material.

Accordingly, it is desirable to provide high-density structures such as integrated circuit devices which overcome or alleviate issues caused by deviations introduced by photolithographic processes, thereby improving performance and manufacturing yield of such devices.

SUMMARY

A structure such as an integrated circuit device is described having a line of material with critical dimensions which vary within a distribution substantially less than that of a mask element, such as a patterned resist element, used in manufacturing the line of material. An amorphization and partial recrystallization process is described for defining a sidewall surface of the line of material, which does not carry the sidewall surface variations of the mask element introduced by photolithographic processes, or other patterning processes, involved in forming the mask element. The mask element is used as an ion implantation mask to form an amorphous phase region within the layer of crystalline phase material. The partial recrystallization process straightens the amorphous/crystalline material interface through crystalline growth at energetically favorable step or kink sites of the interface. The remaining portion of the amorphous phase region is then selectively removed to leave the sidewall surface of the line of material. As a result of this process, the variation of the sidewall surface of the line of material can be controlled much tighter than the variation in the sidewall surface of the mask element. This results in the line of material having improved line definition, with straighter edges and sharper corners, than is possible using the mask element as an etch mask. In embodiments of the technology described herein, the line edge roughness of the line of material is less than or equal to 1 nm, which is much less than is possible utilizing lithographic etch mask technologies.

A method for manufacturing a structure as described herein includes forming a mask element, such as a patterned resist element, overlying a layer of crystalline phase material such as a semiconductor substrate. Ions are implanted into the layer using the mask element as an implantation mask, thereby converting a region of the layer into an amorphous phase. The amorphous phase region has a first interface with crystalline phase material underlying the mask element. The amorphous phase region is then partially recrystallized to form a recrystallized portion adjacent the first interface and leave a remaining portion in the amorphous phase. The remaining portion has a second interface with the recrystallized portion. The remaining portion of the amorphous phase region is then selectively removed to leave a sidewall surface in the layer at a location defined by the second interface.

A structure as described herein includes a line of crystalline phase material having a first sidewall surface and a second sidewall surface. The first sidewall surface and the second sidewall surface each have a line edge roughness less than or equal to 1 nm. In embodiments described herein, the line of crystalline phase material further has a line width roughness between the first sidewall surface and the second sidewall surface that is less than or equal to 1.5 nm.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Other aspects and advantages of the present invention can be seen on review of the drawings, the detailed description, and the claims which follow.

DETAILED DESCRIPTION

The following description is presented to enable any person skilled in the art to make and use the invention, and is provided in the context of a particular application and its requirements. Various modifications to the disclosed embodiment will be readily apparent to those skilled in the art, and the general principles defined herein may be applied to other embodiments and applications without departing from the spirit and scope of the present invention. Thus, the present invention is not intended to be limited to the embodiments shown, but is to be accorded with the widest scope consistent with the principles and features disclosed herein.

FIGS. 1-4 illustrate stages in a manufacturing process flow of an embodiment of the amorphization and partial recrystallization process described herein. It will be understood that the process steps and structures described with reference to FIGS. 1-4 do not describe a complete process for the manufacturing of an integrated circuit device. The amorphization and partial recrystallization process described herein can be utilized in the manufacturing of various types of integrated circuit components.

Figure 1A:
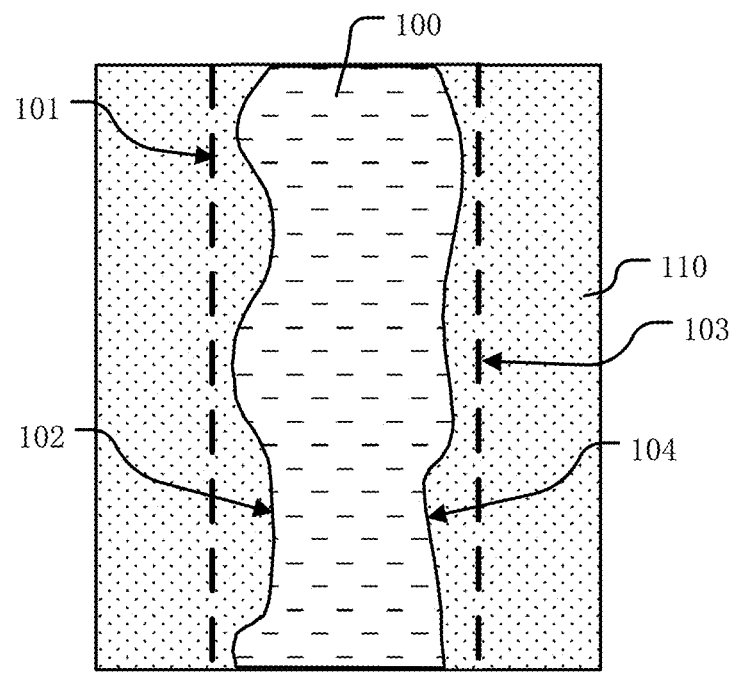
FIGS. 1A, 1B, 2A, 2B, 3A, 3B, 4A and 4B illustrate stages in a manufacturing process flow of an embodiment of the amorphization and partial recrystallization process described herein.
Figure 1B:
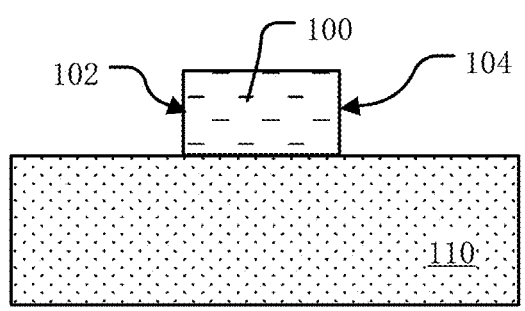

FIGS. 1A and 1B (collectively "FIG. 1") illustrate top and cross-sectional views respectively of a mask element 100 patterned on a material layer 110. The mask element 100 has a first sidewall surface 102 and a second sidewall surface 104. The mask element 100 may be formed by patterning a layer of photoresist using a lithographic process. For example, the mask element 100 may be formed for example using 193 nm lithography, extreme ultraviolet (EUV) radiation, electron beams, nanoimprint lithography, spacer lithography, or double patterning. Alternatively, other materials and patterning processes may be used to form the mask element 100.

The material layer 110 is a layer of crystalline phase material. As described in more detail below, the material layer 110 is a material which can be selectively etched when in an amorphous phase, relative to the crystalline phase of the material. The material layer 110 may for example comprise silicon or other semiconductor material. Alternatively, the material layer 110 may comprise other materials. In some embodiments, the material layer 110 may be an intermediate layer between an underlying layer and the mask element 100.

The mask element 100 has variations in shape as a result of imperfections and pattern fidelity limitations in the patterning process and other factors during the formation of the mask element 100. The dashed lines 101, 103 in the top view of FIG. 1A represent an idealized shape of the mask element 100. The term "line edge roughness" (LER) refers to a statistical measure, such as the standard deviation, of the actual positions of a sidewall surface relative to the mean sidewall surface position along the length of a segment of the sidewall surface. The values of LER described herein refer to a three-sigma standard deviation of the roughness of the sidewall surface, unless indicated otherwise. The term "line width roughness" (LWR) refers to a statistical measure, such as the standard deviation, of the actual line width relative to the mean line width along the length of a segment of a line having two sidewall surfaces. The values of LWR described herein refer to a three-sigma standard deviation of the roughness of the width, unless indicated otherwise.

As can be seen in FIGS. 1A and 1B, the first sidewall surface 102 and the second sidewall surface 104 each have a pronounced LER. Accordingly, the mask element 100 has a pronounced LWR.

Figure 2A:
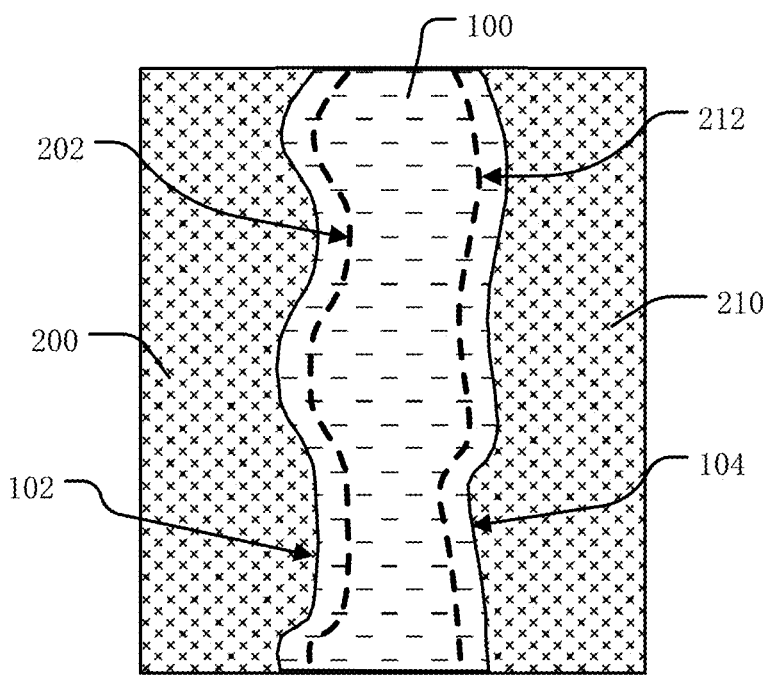
Figure 2B:
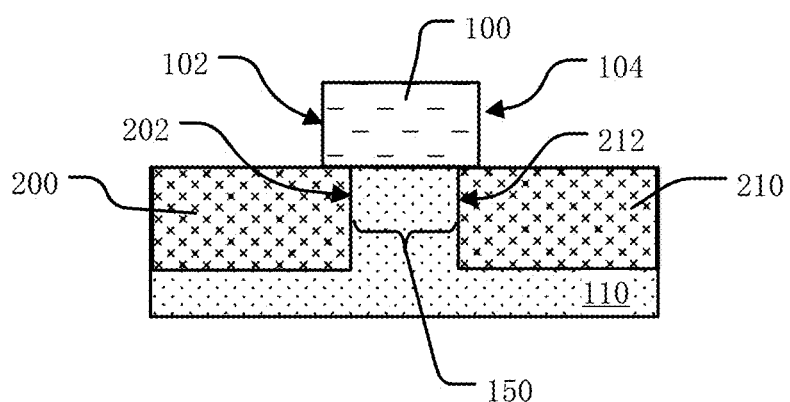

Next, ion implantation is performed on the structure illustrated FIGS. 1A and 1B using the mask element 100 as an implantation mask, resulting in the structure illustrated in the top and cross-sectional views of FIGS. 2A and 2B (collectively "FIG. 2"). The ion implantation converts a first region 200 of the material layer 110 proximate the first sidewall surface 102 into an amorphous phase. The first region 200 has an interface 202 with crystalline phase material in a region 150 of the material layer 110 underlying the mask element 100. As shown in FIGS. 2A and 2B, the variation in the first sidewall surface 102 is carried through to the crystalline/amorphous interface 202 of the first region 200. Due to lateral scattering of the atoms, the first region 200 extends a distance beneath the mask element 100.

In the illustrated embodiment, the ion implantation is performed to amorphize the material layer 110 using a neutral species such as silicon, germanium, or xenon, so that additional charges are not introduced into the material layer 110. In some embodiments, the ion implantation is performed using atoms which are same as that of the material layer 110. For example, in one embodiment in which the material layer 110 is silicon, silicon atoms are used in the ion implantation.

The ion implantation also converts a second region 210 of the material layer 110 proximate the second sidewall surface 104 into the amorphous phase. The second region 210 has an interface 212 with the crystalline phase material in the region 150. As shown in FIGS. 2A and 2B, the variation in the second sidewall surface 104 is carried through to the crystalline/amorphous interface 212 of the second region 210.

Figure 3A:
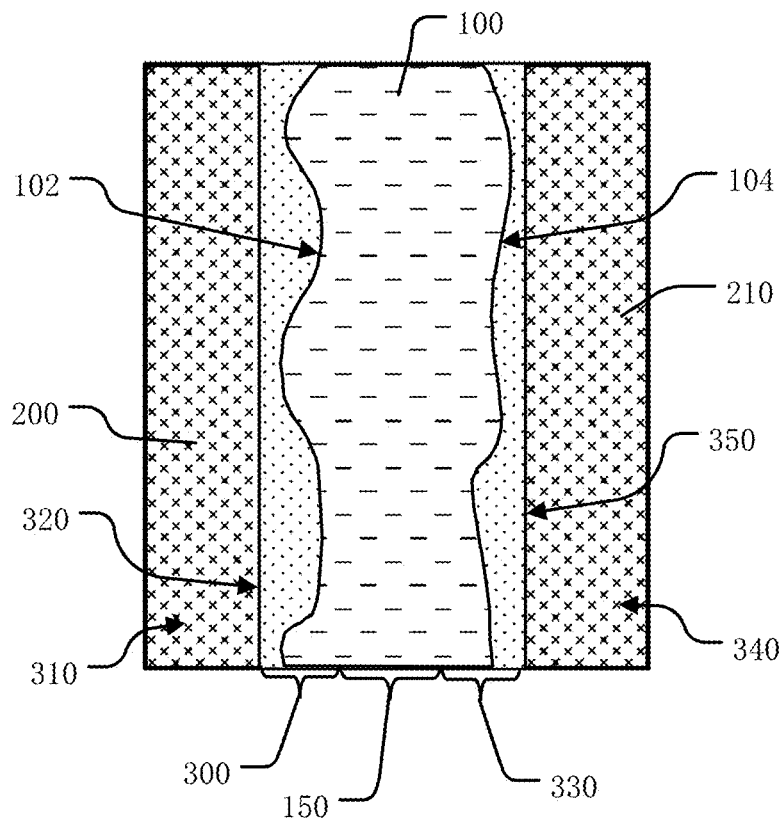
Figure 3B:
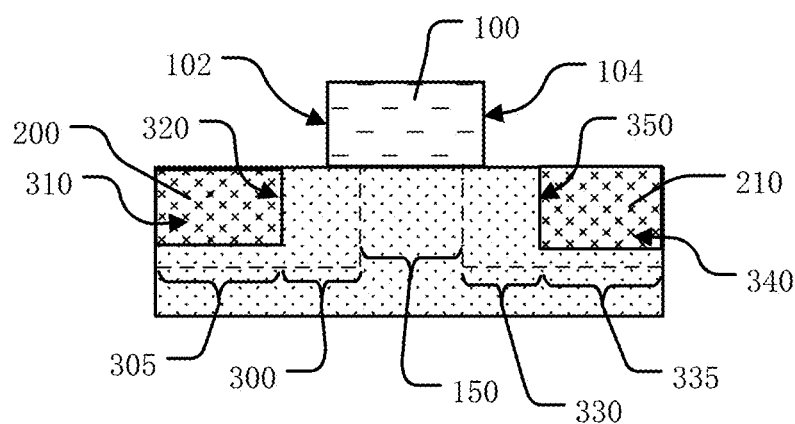

Next, annealing is performed on the structure illustrated in FIGS. 2A and 2B to partially recrystallize the first region 200 and the second region 210, resulting in the structure illustrated in the top and cross-sectional view of FIGS. 3A and 3B (collectively "FIG. 3"). The temperature and duration of the annealing process can be determined empirically, and can vary from embodiment to embodiment.

As described in more detail below with respect to FIGS. 5A-5F, 6A-6C and 7, the partial recrystallization process straightens a crystalline/amorphous material interface along a direction parallel to a plane of the crystal lattice of the material layer 110. This straightening of the amorphous/crystalline material interface occurs through crystalline growth at energetically favorable atomic step or kink sites of the interface. The straightening depends on the temperature and duration of the annealing process, as well as which plane of the crystal lattice the interface extends along.

As shown in FIGS. 3A and 3B, the partial recrystallization of the first region 200 forms a recystallized portion 300 and a recrystallized portion 305 of the first region 200, and leaves a remaining portion 310 in the amorphous phase. The remaining portion 310 in the amorphous phase has an interface 320 with the recrystallized portion 300. As a result of the partial recrystallization process, the variation in the interface 320 is much less than the variation in the original interface 202, and thus much less than the variation in the first sidewall surface 102 of the mask element 100. In other words, the interface 320 is much straighter than the first sidewall surface 102 of the mask element 100 from which the interface 320 originated.

As is also shown in FIGS. 3A and 3B, the partial recrystallization of the second region 210 forms a recrystallized portion 330 and a recrystallized portion 335 of the second region, and leaves a remaining portion 340. The remaining portion 340 in the amorphous phase has an interface 350 with the recrystallized portion 330. As a result of the partial recystallization process, the variation in the interface 350 is much less than the variation in the original interface 212, and thus much less than the variation in the second sidewall surface 104 of the mask element 100. In other words, the interface 350 is much straighter than the second sidewall surface 104 of the mask element 100 from which the interface 350 originated.

Figure 4A:
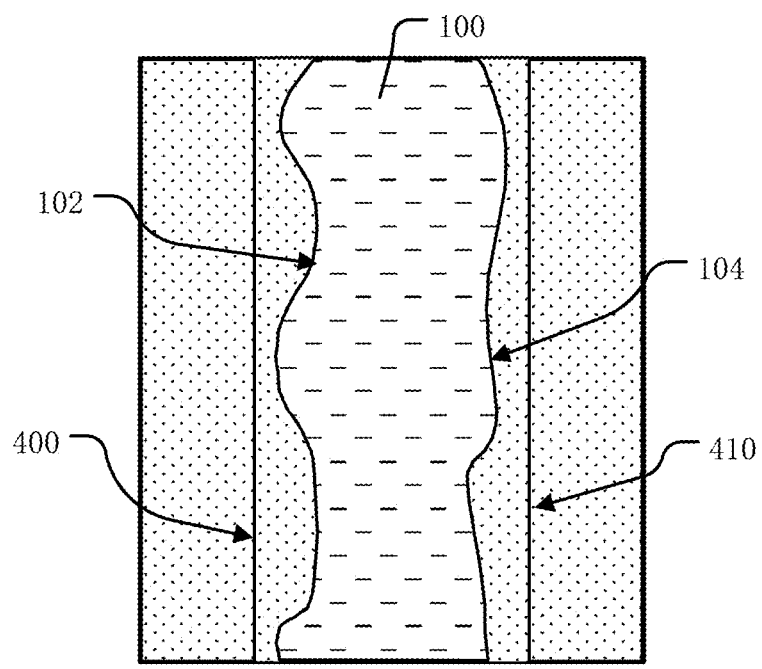
Figure 4B:
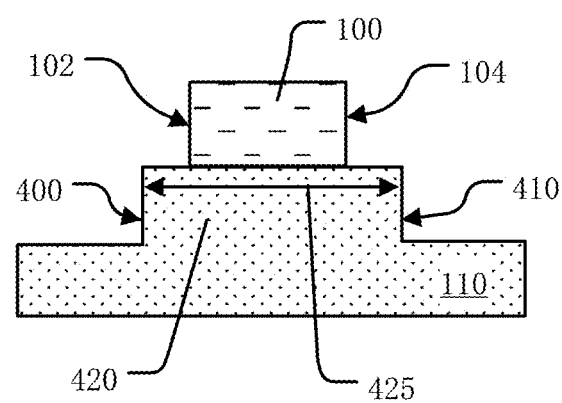

Next, etching is performed to selectively remove the remaining portion 310 of the first region 210 and remove the remaining portion 340 of the second portion 210, resulting in the structure illustrated in the top and cross-sectional view of FIGS. 4A and 4B (collectively "FIG. 4"). The etching process selectively etches the amorphous phase material of the material layer 110, relative to the crystalline phase material of the material layer 110. The etch process used depends on the material of the material layer 110, and can vary from embodiment to embodiment. In one embodiment in which the material layer 110 is silicon, the selective etching process is performed using hydrofluoric acid (HF).

As shown in FIGS. 4A and 4B, the selective removal of the remaining portion 310 leaves a sidewall surface 400 in the material layer 110 at a location defined by the interface 320. Similarly, the selective removal of the remaining portion 340 leaves a sidewall surface 410 in the material layer 110 at a location defined by the interface 350.

The sidewall surface 400 and the sidewall surface 410 define opposing sides of a line 420 of crystalline phase material in the material layer 110. The line 420 has a line width 425. The line width 425 may be for example 15 nm, or less.

As a result of the preceding amorphization and partial recrystallization processes, the variation of the sidewall surfaces 400, 410 of the line can be controlled over a distribution much less than the variation in the sidewall surfaces 102, 104 of the mask element 100. These small variations arise because the sidewall surfaces 400, 410 have variations dependent upon the variations in the recrystallization interfaces 320, 350 used to define them. The variations in the recrystallization interfaces 320, 350 are in turn determined by the straightening of the amorphous/crystalline material interface through crystalline growth at energetically favorable atomic step or kink sites, which can be readily controlled. As a result, these variations in the sidewall surfaces 400, 410, can be controlled over a distribution much less than the variations due to photolithographic processes, or other patterning processes, involved in the formation of the sidewall surfaces 102, 104 of the mask element 100. The results in the line 420 having improved line definition, with straighter sidewall surfaces 400, 410, than is possible using the mask element 100 as an etch mask. Therefore, integrated circuit elements, such as FinFET transistors, interconnect lines or other small features such as nano-wires, implemented using the line 420 will exhibit uniform performance and high yield in a way not possible in the prior art.

As an example, using a lithographic process, the LER of the first sidewall surface 102 and the second sidewall surface 104 of the mask element 100 can be greater than 4 nm. As explained above, variations in the sidewall surfaces 400, 410 of the line 420 are substantially less than that of the variations in the sidewall surfaces 102, 104. As a result, the LER of the sidewall surfaces 400, 410 much smaller, such as for example less than or equal to 1 nm. This results in the width 425 of the line 420 having a LWR substantially less than that of the mask element 100, such as for example less than or equal to 1.5 nm.

In some embodiments the sidewall surfaces 400, 410 vary by +/- the atomic step size of the material of material layer 110. In one embodiment in which the material layer 110 is silicon, the variation is the atomic step size of silicon, +/-0.3 nm.

FIGS. 5A-5F illustrate an example of a cross-sectional view of the straightening of an amorphous/crystalline material interface 500 following an ion implantation.

Figure 5A:
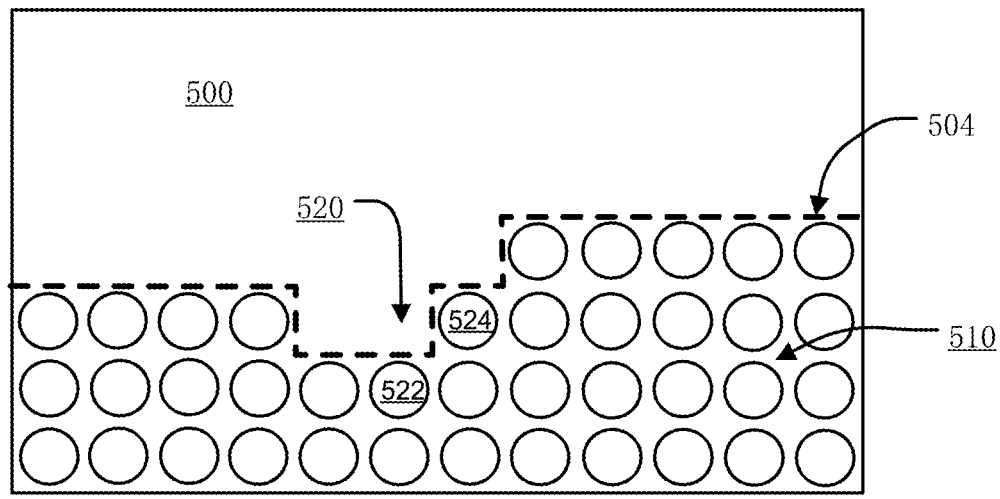
FIGS. 5A, 5B, 5C, 5D, 5E and 5F illustrate an example of the partial recrystallization process for straightening out the amorphous/crystalline material interface through crystalline growth at energetically favorable step or kink sites of the interface.

FIG. 5A illustrates a cross-sectional view after performing ion implantation to convert a region 500 into an amorphous phase. The amorphous phase region 500 has an interface 504, represented by a dashed line in the Figure, with atoms arranged in a crystal lattice within crystalline phase region 510. The type of crystal lattice within region 510 depends upon the material of the region 510. In one embodiment, the atoms in region 510 are silicon atoms arranged in a diamond cubic crystal structure. Materials having other types of crystal lattices structures may alternatively be used. Due to the ion implantation, the atoms (not illustrated) in the amorphous phase region 510 are arranged randomly throughout amorphous phase region 500.

As shown in FIG. 5A, the interface 504 includes kink sites which define the roughness of the interface 504. A kink site is a location along the interface 504 where two or more atoms in the crystalline phase region 510 may be bonded with a single atom from the amorphous phase region 510. For example, kink site 520 is the location where atom 522 and atom 524 may be bonded together by a single atom. The kink sites are energetically favorable sites for crystalline growth because it is more difficult to bond an atom on an already flat crystal surface. An atom which bonds to a flat surface will include several dangling bonds, which causes the total energy of the atom to be relatively high. In contrast, an atom which bonds to a kink site will have less dangling bonds than if it were to attach to a flat surface, and thus a lower total energy. As a result, during annealing, atoms within the amorphous phase region 510 will bond at these energetically favorable kink sites, which advances crystalline growth along a crystal plane of the region 510. This in turn causes the straightening of the amorphous/crystalline interface.

Figure 5B:
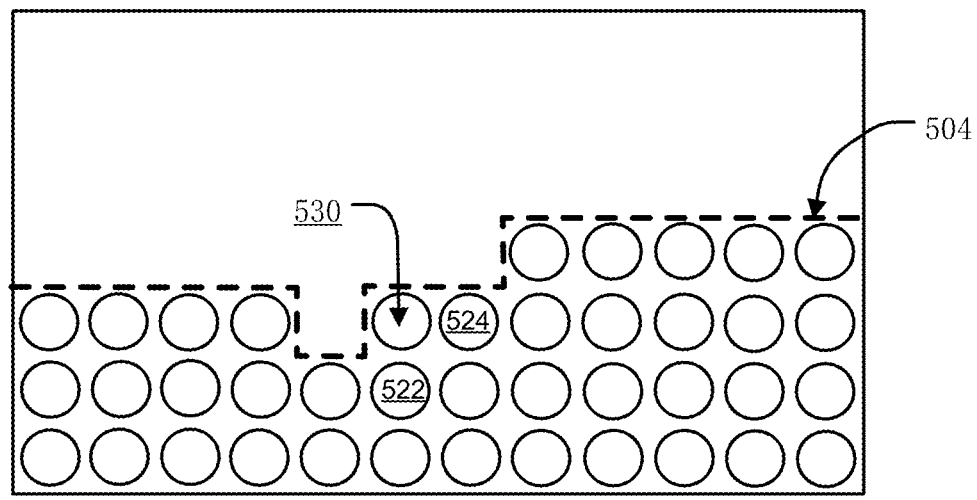
Figure 5C:
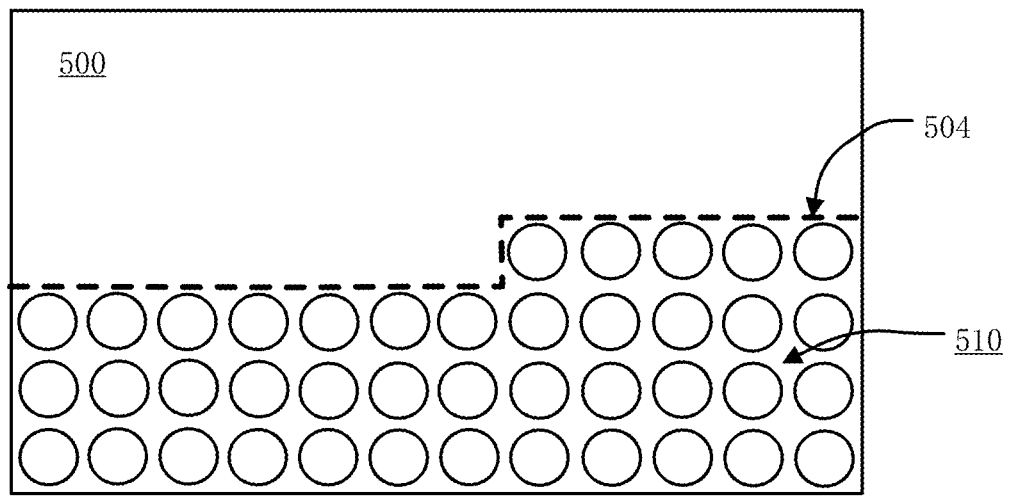
Figure 5D:
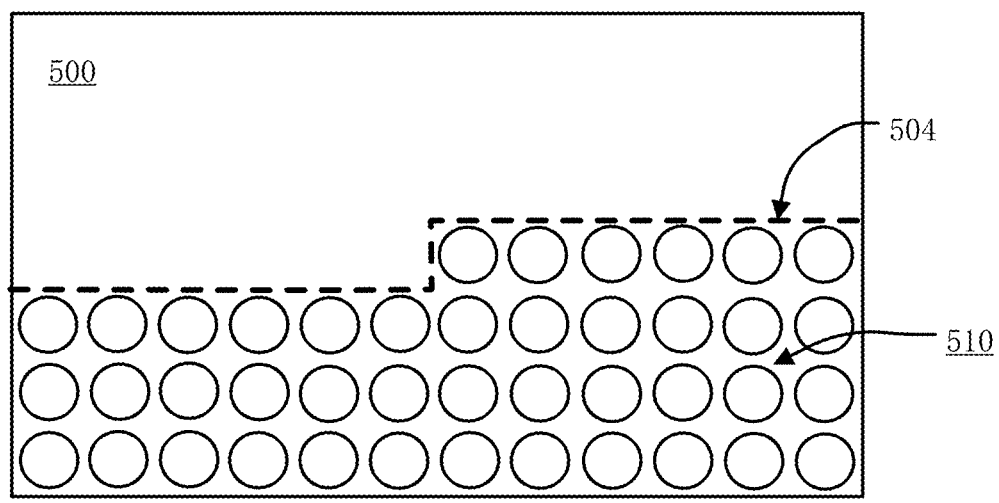
Figure 5E:
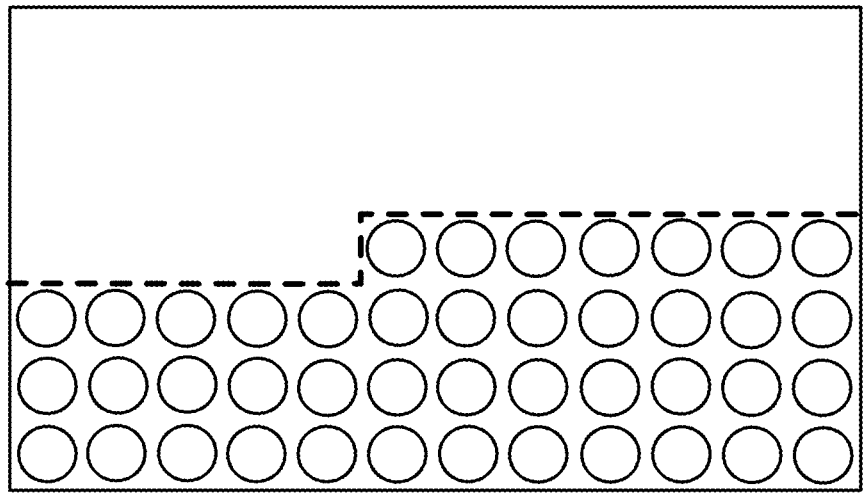
Figure 5F:
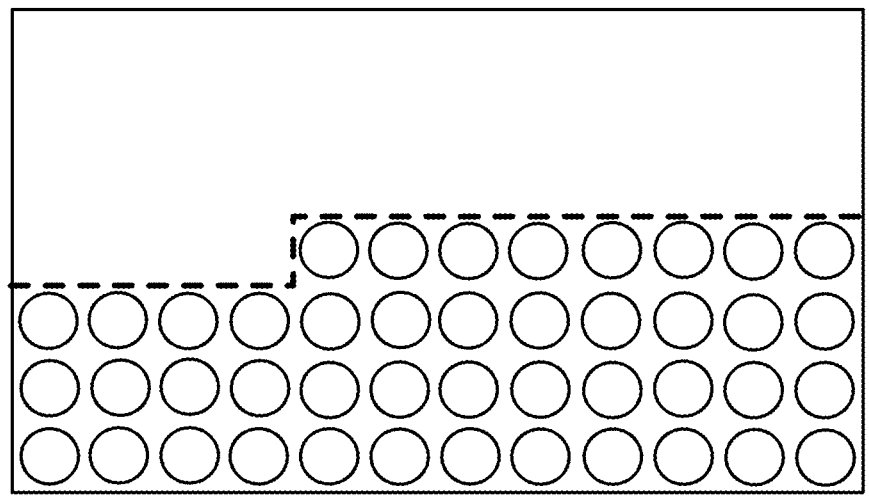

FIG. 5B illustrates a stage in the progression of the partial recrystallization of the amorphous phase region 500 during annealing. As shown in FIG. 5B, an atom 530 from the amorphous phase region 510 bonds to the atoms 524 and 522 in the crystalline phase region 510, thus recrystallizing at the kink site. As can be seen upon comparison of FIGS. 5A and 5B, this causes a shift in the interface 504.

FIGS. 5C, 5D, 5E and 5F illustrate further stages in the progression of the partial recrystallization of the amorphous phase region 500 during annealing. As shown in these figures, additional atoms from the amorphous phase region 510 continue to bond at available kink sites, thus causing the interface 504 to advance and straighten.

Figure 6A:
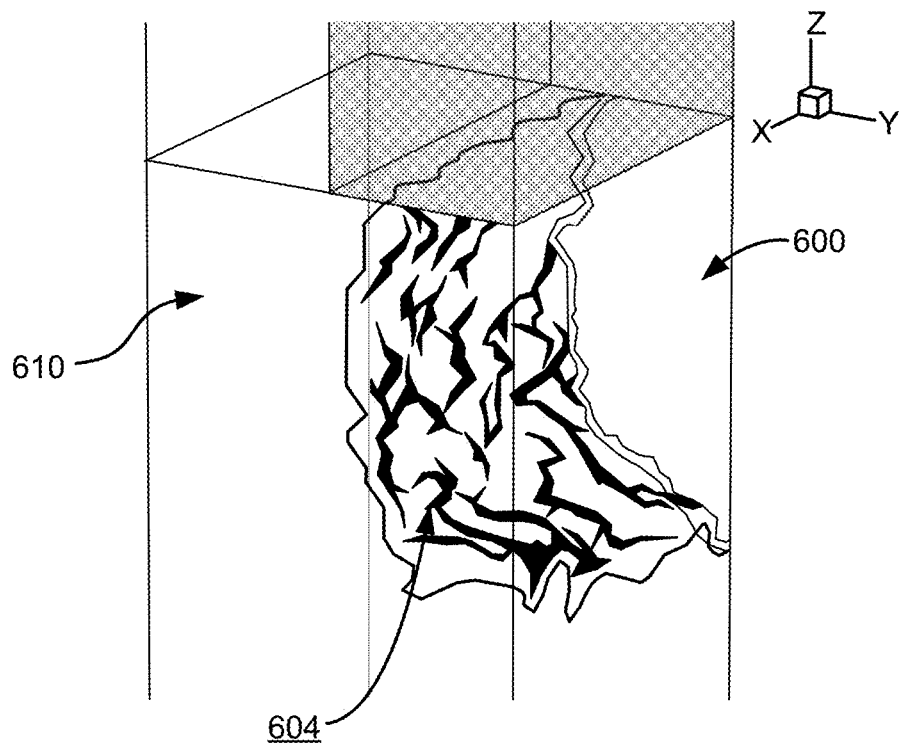
FIGS. 6A, 6B and 6C illustrate an example simulation of the partial recrystallization process.
Figure 6B:
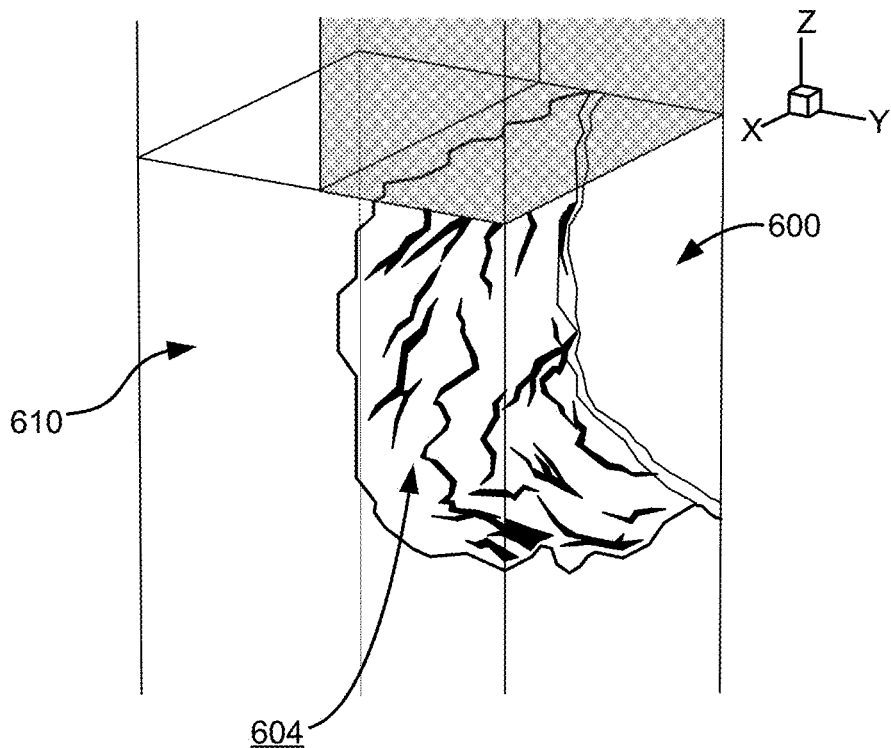
Figure 6C:
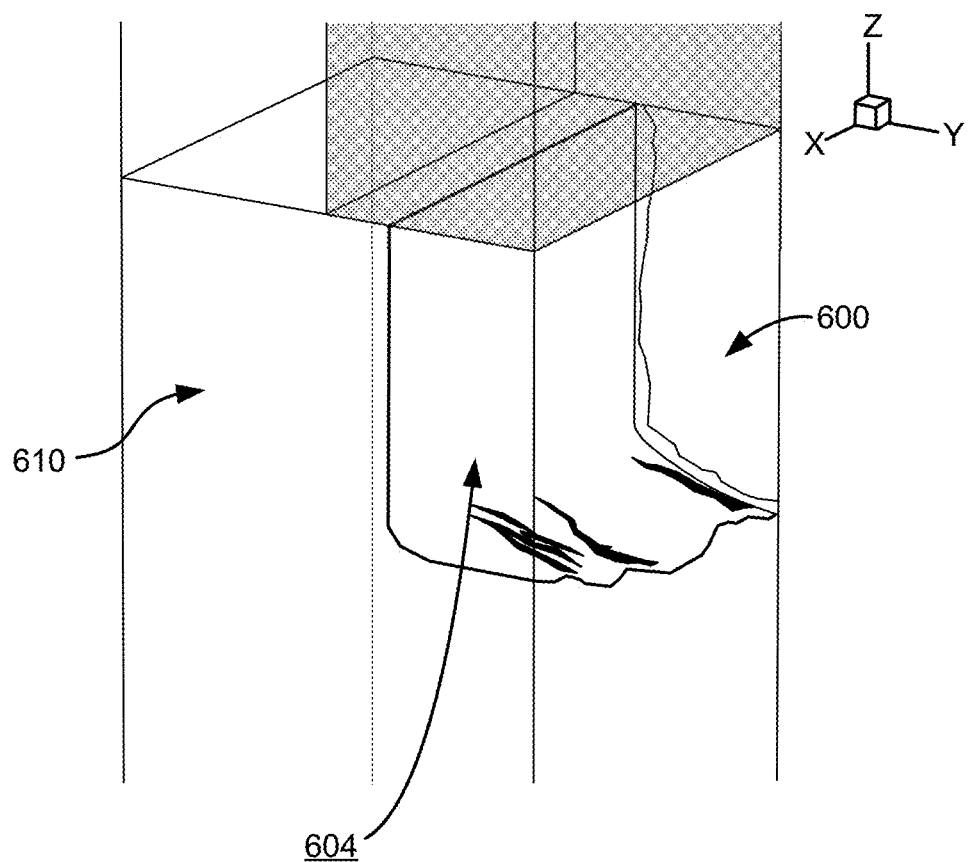

FIGS. 6A-6C illustrate a perspective view of a simulation of the straightening of an amorphous/crystalline material interface 504 following an ion implantation. The simulation can be made using a simulator such as the Sentaurus tools available from Synopsys, Inc.

FIG. 6A illustrates a perspective view after performing ion implantation to convert a region 600 of a layer of crystalline phase material into an amorphous phase. In this example, the layer of crystalline phase material is a silicon wafer with a (100) orientation. The mask edge is along a <110> crystal direction, and amorphization is performed using Ge atoms. The amorphous phase region 600 has an interface 604 with atoms arranged in a crystal lattice within the crystalline phase region 610.

FIG. 6B illustrates a stage in the progression of the partial recrystallization of the amorphous phase region 610 during annealing. As can be seen upon comparison of FIGS. 6A and 6B, the recrystallization causes the interface 604 to shift and straighten.

FIG. 6C illustrates another stage in the procession of the recrystallization of the amorphous phase region 610 during annealing. As can be seen upon comparison of FIGS. 6B and 6C, the continued recrystallization causes the interface 604 to further shift and straighten.

Figure 7:
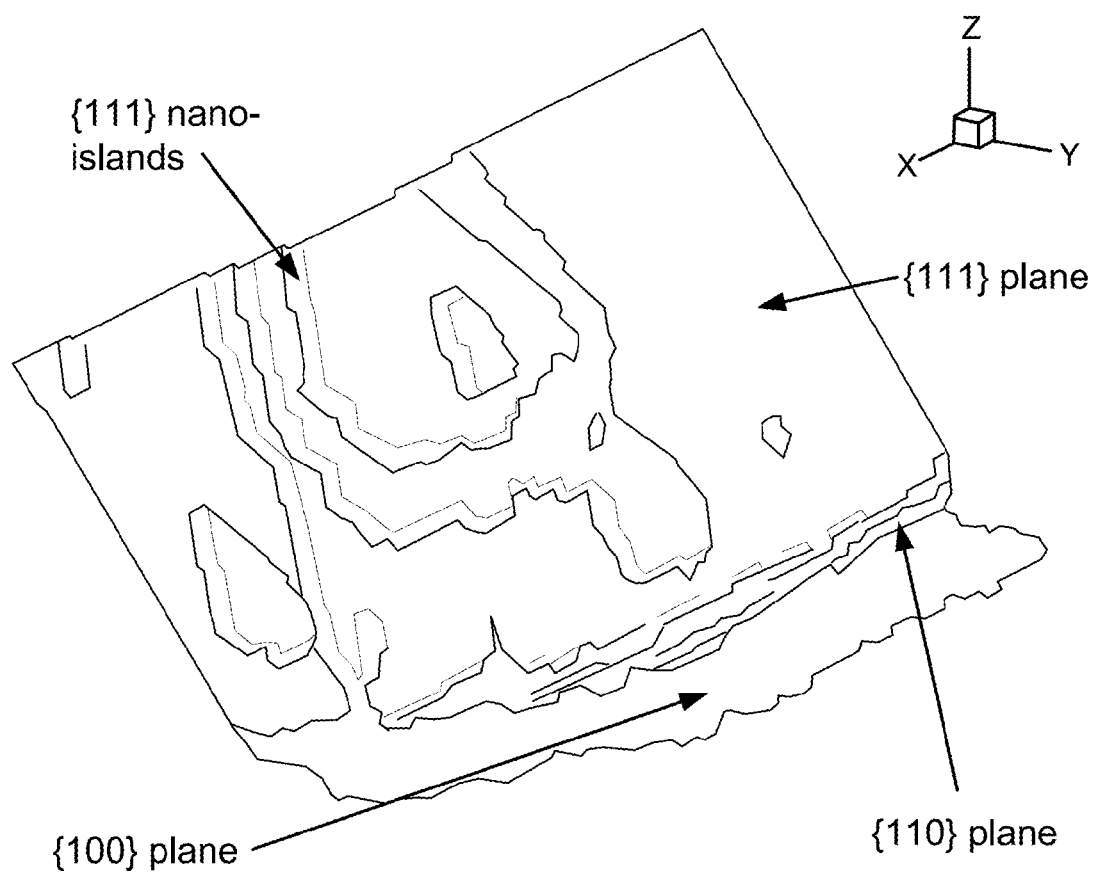
FIG. 7 illustrates an example simulation of the partial recrystallization process for various surfaces along different planes of a crystal lattice of a material having a diamond cubic crystal structure.

FIG. 7 illustrates an example simulation of the partial recrystallization process for various surfaces along different planes of a crystal lattice for a material having a diamond cubic crystal structure. In this example, the material is silicon.

As can be seen in FIG. 7, the roughness of the amorphous/crystalline material interface depends upon which plane of the crystal lattice the interface extends along. Thus, in some embodiments, the mask element and the material layer are arranged such that the amorphous/crystalline material interface extends along a direction parallel to the plane of the crystal lattice of the material layer which will be the straightest following annealing.

As shown in FIG. 7, for the diamond cubic crystal structure, the {111} planes are the straightest after annealing, the {110} planes are the next straightest, and the {100} planes are the least straight. This variation in the straightness among the various planes occurs because a surface along the {111} planes has the slowest growth rate and a surface along the {100} planes has the fastest growth rate. Therefore, on a {111} plane, the probability that an atom will attach to a flat surface is lower the probability that an atom will attach to a flat surface on a {100} plane. Thus, in one embodiment in which the material layer comprises a material having a diamond cubic crystal structure, such as silicon, the top surface of the material layer is along a (110) plane, and the sidewalls are formed in the material layer extending along a direction parallel to a {111} plane of the diamond cubic crystal structure.

In the examples described above, the amorphization and partial recrystallization process was carried out to straighten the sidewall surfaces extending along the longer sides of an elongated line of material. As described below with respect to FIGS. 8-11, the techniques described herein can also be carried out to simultaneously straighten the sidewall surface along the shorter side of the elongated line of material, in order to sharpen the corners between the longer and shorter sides.

FIGS. 8-11 illustrate stages in a manufacturing process flow of the amorphization and partial recrystallization process illustrated in FIGS. 2-4, using the mask element 800 illustrated in FIG. 8.

Figure 8A:
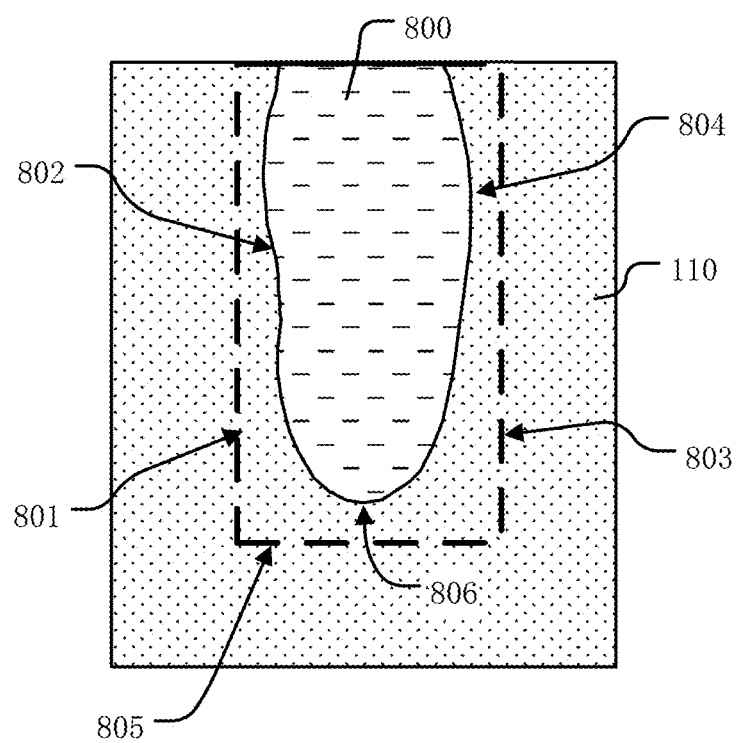
FIGS. 8A, 8B, 9A, 9B, 10A, 10B, 11A and 11B illustrate stages in a manufacturing process flow of the amorphization and partial recrystallization process illustrated in FIGS. 2-4, using the mask element illustrated in FIG. 8.
Figure 8B:
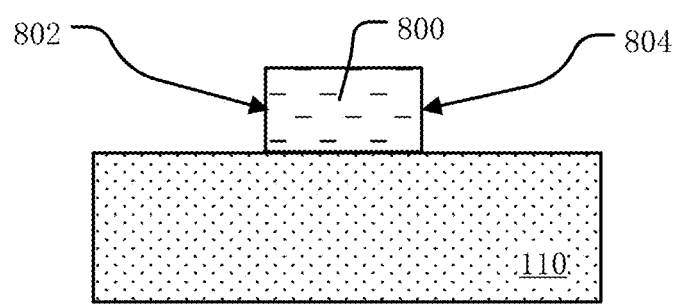

FIGS. 8A and 8B illustrate top and cross-sectional views respectively of a mask element 800 patterned on the material layer 110 of crystalline phase material. The dashed lines 801, 803, 805 in the top view of FIG. 8A represent an idealized shape of the mask element 800. The mask element 800 has an elongated shape with a first sidewall surface 802 a second sidewall surface 804 along the longer sides, and a third sidewall surface 806 along a shorter side. The mask element 800 may be formed by patterning a layer of photoresist using a lithographic process. Alternatively, other materials and patterning processes may be used to form the mask element 800.

Figure 9A:
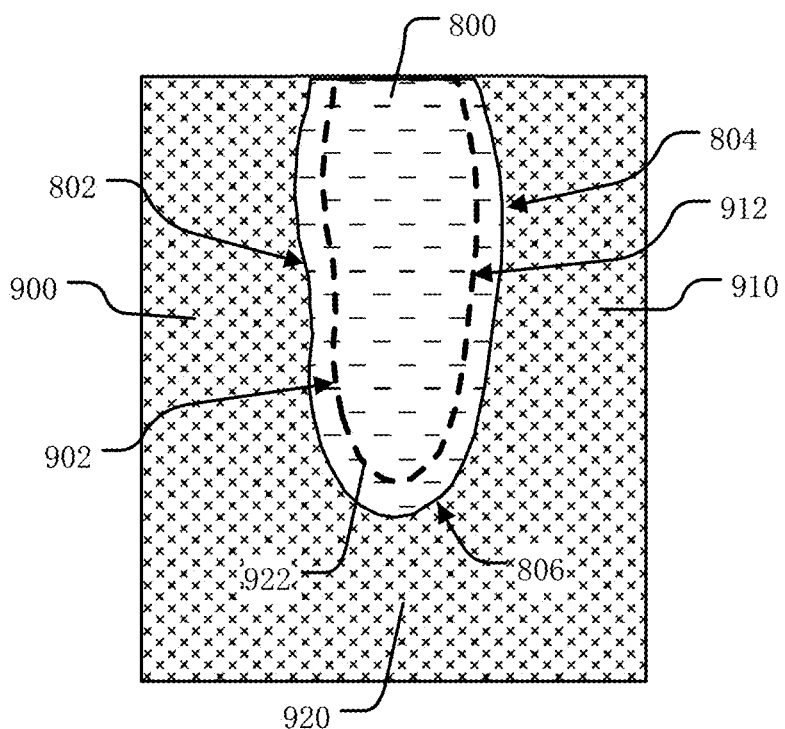
Figure 9B:
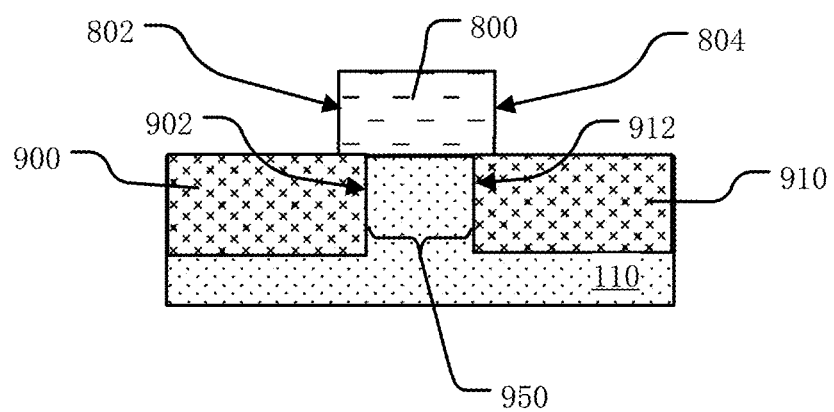

Next, ion implantation is performed on the structure illustrated FIGS. 8A and 8B using the mask element 800 as an implantation mask, resulting in the structure illustrated in the top and cross-sectional views of FIGS. 8A and 8B. The ion implantation converts a first region 900 of the material layer 110 proximate the first sidewall surface 802 into an amorphous phase. The first region 900 has an interface 902 with crystalline phase material in a region 950 of the material layer 110 underlying the mask element 800. As shown in FIGS. 9A and 9B, the variation in the first sidewall surface 802 is carried through to the crystalline/amorphous interface 902 of the first region 900. Due to lateral scattering of the atoms, the first region 900 extends a distance beneath the mask element 800.

The ion implantation also converts a second region 910 of the material layer 110 proximate the second sidewall surface 804 into the amorphous phase. The second region 910 has an interface 912 with the crystalline phase material in the region 950. The ion implantation also converts a third region 920 of the material layer 110 proximate the third sidewall surface 806 into the amorphous phase. The third region 920 has an interface 922 with the crystalline phase material in the region 950.

Next, annealing is performed on the structure illustrated in FIGS. 9A and 9B to partially recrystallize the first region 900, the second region 910 and the third region 920, resulting in the structure illustrated in the top and cross-sectional view of FIGS. 9A and 9B. The temperature and duration of the annealing process can be determined empirically, and can vary from embodiment to embodiment.

As described above, the partial recrystallization process straightens a crystalline/amorphous material interface along a direction parallel to a plane of the crystal lattice of the material layer 110.

Figure 10A:
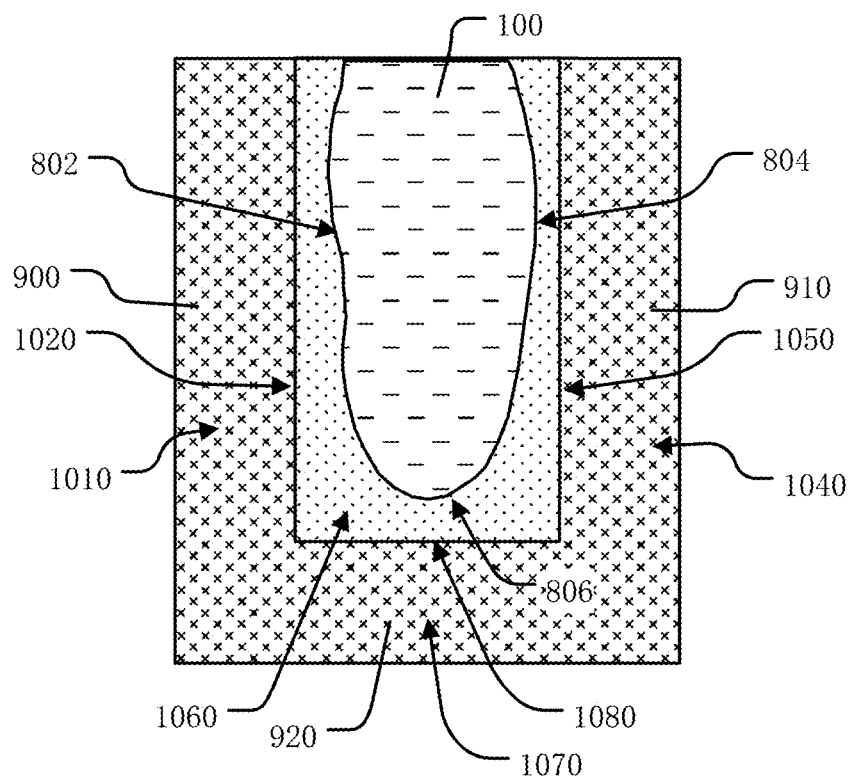
Figure 10B:
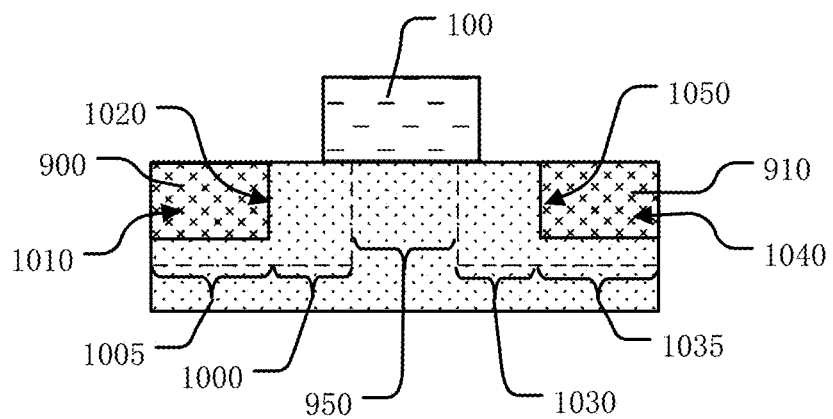

As shown in FIGS. 10A and 10B, the partial recrystallization of the first region 900 forms a recystallized portion 1000 and a recystallized portion 1005 of the first region 900, and leaves a remaining portion 1010. The remaining portion 1010 in the amorphous phase has an interface 1020 with the recrystallized portion 1000. As a result of the partial recrystallization process, the variation in the interface 1020 is much less than the variation in the original interface 902, and thus much less than the variation in the first sidewall surface 802 of the mask element 800. In other words, the interface 1020 is much straighter than the first sidewall surface 802 of the mask element 800 from which the interface 1020 originated.

As is also shown in FIGS. 10A and 10B, the partial recrystallization of the second region 910 forms a recystallized portion 1030 and a recystallized portion 1035 of the second region 910, and leaves a remaining portion 1040. The remaining portion 1040 in the amorphous phase has an interface 1050 with the recrystallized portion 1030. As a result of the partial recrystallization process, the variation in the interface 1050 is much less than the variation in the original interface 912, and thus much less than the variation in the second sidewall surface 804 of the mask element 800. In other words, the interface 1050 is much straighter than the second sidewall surface 804 of the mask element 800 from which the interface 1050 originated.

The partial recrystallization of the third region 920 forms a recrystallized portion 1060 of the third region 920, and leaves a remaining portion 1070. The remaining portion 1070 in the amorphous phase has an interface 1080 with the recrystallized portion 1060. As a result of the partial recrystallizaton process, the variation in the interface 1080 is much less than the variation in the original interface 922, and thus in turn much less that the variation in the third sidewall surface 806 of the mask element 800 from which the interface 1050 originated.

Next, etching is performed to selectively remove the remaining portion 1010 of the first region 900, remove the remaining portion 1040 of the second region 910, and remove the remaining portion 1070 of the third region 920. The resulting structure is illustrated in the top and cross-sectional views of FIGS. 11A and 11B.

Figure 11A:
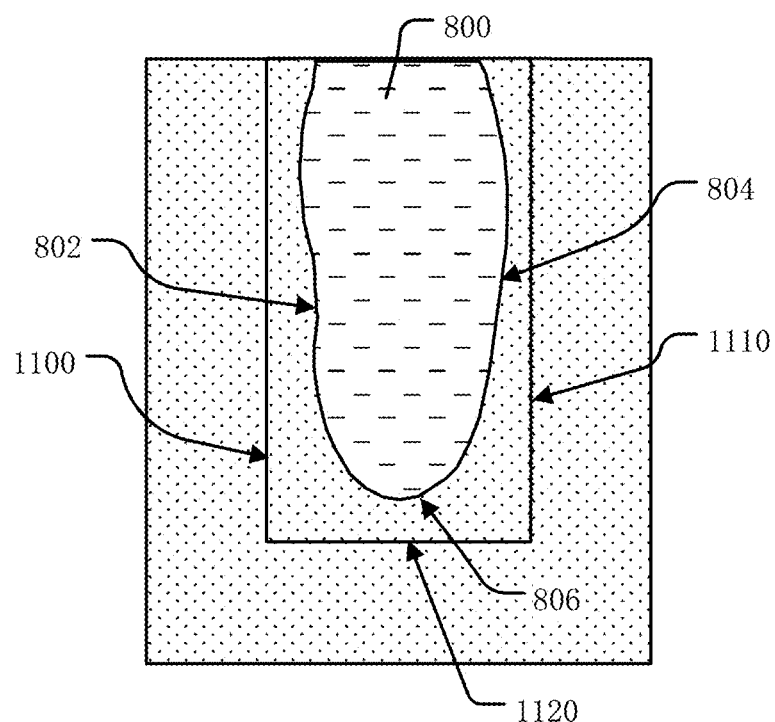
Figure 11B:
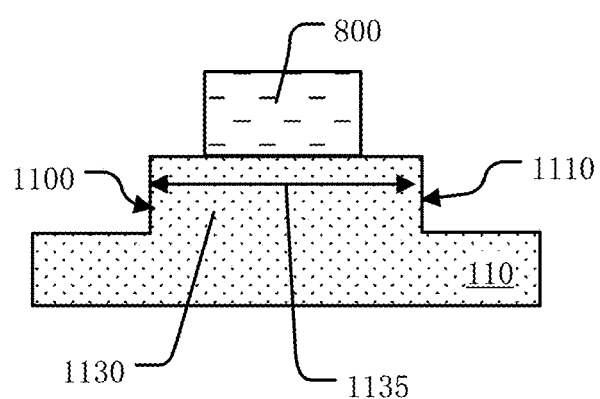

As shown in FIGS. 11A and 11B, the selective removal of the remaining portion 1010 leaves a sidewall surface 1100 in the material layer 110 at a location defined by the interface 1020. Similarly, the selective removal of the remaining portion 1040 leaves a sidewall surface 1110 in the material layer 110 at a location defined by the interface 1050. Also, the selective removal of the remaining portion 1070 leaves a sidewall surface 1120 in the material layer 110 at a location defined by the interface 1080.

The sidewall surface 1100 and the sidewall surface 1110 define opposing sides of a line 1130 of crystalline phase material in the material layer 110. The sidewall surface 1120 extends between the sidewall surfaces 1100 and 1110 to define an end or termination of the line 1130. The line 1130 has a line width 1135.

The amorphization and partial recrystallization process results in the line 1130 having improved line definition, with straighter sidewall surfaces 1100, 1110, 1120 and sharper corners at the intersection of the sidewall surfaces, than is possible using the mask element 800 as an etch mask.

The corner rounding radius is the radius of a 90-degree arc of a hypothetical circle having a mean position along the intersection between generally perpendicular sides of a line. As an example, using a lithographic process, the corner rounding radius can be greater than 50 nm. Using the techniques described herein, the corner rounding radius can for example be less than 3 nm.

As described above, the roughness of the amorphous/crystalline material interface after annealing depends upon which plane of the crystal lattice the interface extends along. Thus, in preferred embodiments, the mask element 800 and the material layer 110 are arranged such that the subsequently formed sidewall surfaces 1100, 1110 respectively extend along a first direction parallel to one plane of the crystal lattice of the material layer 100, and the sidewall surface 1120 extends along a second direction parallel to another plane of the crystal lattice of the material layer 110. In one embodiment in which the material layer 110 is a material having a diamond cubic crystal structure, the sidewall surfaces 1100, 1110 extend along a direction parallel to one of a {111} plane and a {110} plane of the diamond cubic crystal structure, and the sidewall surface 1120 extends along a direction parallel to the other of the {111} plane and the {110} plane.

In the examples described above, the amorphization and partial recrystallization process was preferably carried out to form sidewall surfaces of the line of material extending along particular planes of the crystal lattice of the material layer 110 which are straightened during the process. However, in some devices, other considerations such as stress engineering, carrier mobility, and surface charges/traps may make it undesirable to implement certain integrated circuit elements using a line of material oriented along these particular planes. For example, certain integrated circuit elements may typically be formed in silicon using a {100} wafer with a <110> transistor direction.

As used herein, a wafer orientation is defined by its normal direction, and currently the {100} family of directions is standard in semiconductor fabrication. Because of crystallographic symmetry, all the specific directions in the {100} family have the same recrystallization properties. Whereas a family of wafer orientation directions is denoted herein with curly brackets, if a specific direction is referenced herein, it is enclosed in parentheses, such as (100). Most modern lithographic processes orient all transistors such that their longitudinal direction is the <110> family of crystallographic directions. As used herein, the "longitudinal" direction of a transistor is the direction parallel to current flow in the transistor, and the "transverse" direction of a transistor is the direction cross-wise to the current flow in the transistor. A family of lithographic orientation directions is denoted with angle brackets, whereas if a specific direction is referenced herein, it is enclosed in square brackets, such as [110].

As described below with respect to FIGS. 12-14, the techniques described herein can also be carried out to form a line of material that can then be used as an etch mask during the patterning of an underlying layer of material. In doing so, a line having straight edges and sharp corners can be formed in the underlying layer, without being limited to particular orientations within the underlying layer.

FIGS. 12-14 illustrate stages in a manufacturing process flow of a second embodiment of the amorphization and partial recrystallization process described herein.

Figure 12A:
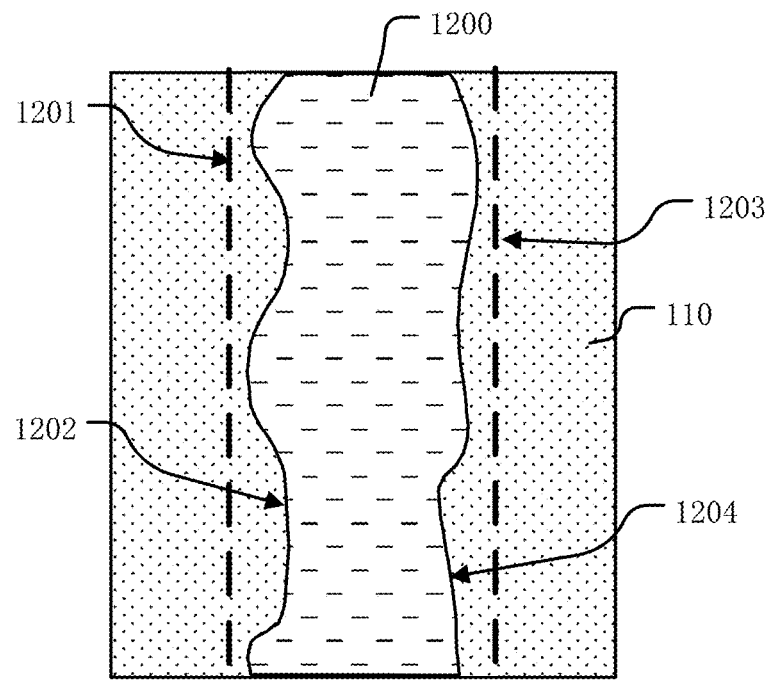
FIGS. 12A, 12B, 13A, 13B, 14A and 14B illustrate stages in a manufacturing process flow of a second embodiment of the amorphization and partial recrystallization process described herein.
Figure 12B:
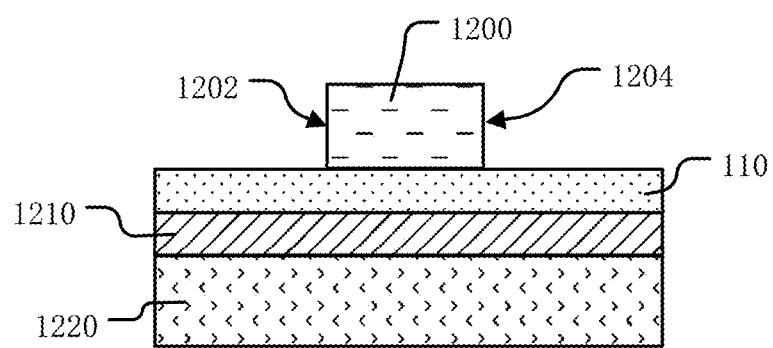

FIGS. 12A and 12B illustrate top and cross-sectional views respectively of a mask element 1200 patterned on the material layer 110 of crystalline phase material. The dashed lines 1201, 1203 in the top view of FIG. 12A represent an idealized shape of the mask element 1200. The mask element 1200 has a first sidewall surface 1202 and a second sidewall surface 1204. The mask element 1200 may be formed by patterning a layer of photoresist using a lithographic process. Alternatively, other materials and patterning processes may be used to form the mask element 1200.

As shown in FIG. 12B, the material layer 110 is separated from material layer 1220 by an intermediate layer 1210. The intermediate layer 1210 protects the material layer 1220 during the amorphization and partial recrystallization process carried out the material layer 110 described below. The intermediate layer 1210 may comprise for example silicon dioxide. Alternatively, the intermediate layer 1210 may comprise other materials.

The material layer 1220 may for example comprise silicon or other semiconductor material. Alternatively, the material layer 1220 may comprise other materials. For example, the material layer 1220 may be polysilicon or a metal material. The multilayer structure illustrated in FIGS. 13A and 13B may for example be manufactured using silicon-on-insulator (SOI) techniques. Alternatively, rather than an SOI layer, other materials with strong anisotropic etching properties may be used for layer 110.

Next, the amorphization, partial recrystallization, and selective etching of amorphous phase material as described above with respect to FIGS. 2-4 are performed on the structure illustrated in FIGS. 12A and 12B. The resulting structure is illustrated in the cross-sectional and top views of FIGS. 13A and 13B.

Figure 13A:
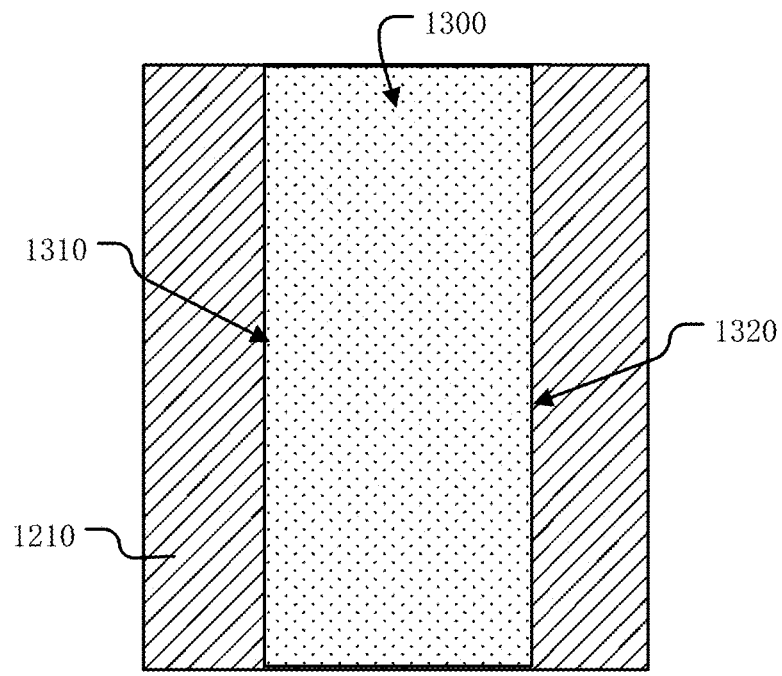
Figure 13B:
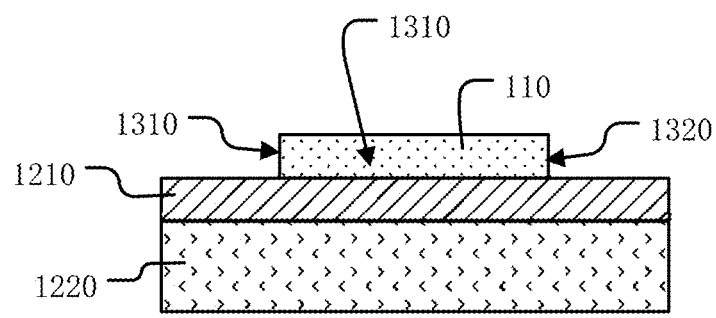

As shown in FIGS. 13A and 13B, this process forms a line 1300 of material within the material layer 110. The line 1300 includes a first sidewall surface 1310 and a second sidewall surface 1320 at locations defined by amorphous/crystalline interfaces formed during the amorphization and partial recrystallization of the material layer 110.

The amorphization and partial recrystallization process results in the line 1300 having improved line definition, with straighter sidewall surfaces 1310, 1320, than is possible using the mask element 800 as an etch mask.

Figure 14A:
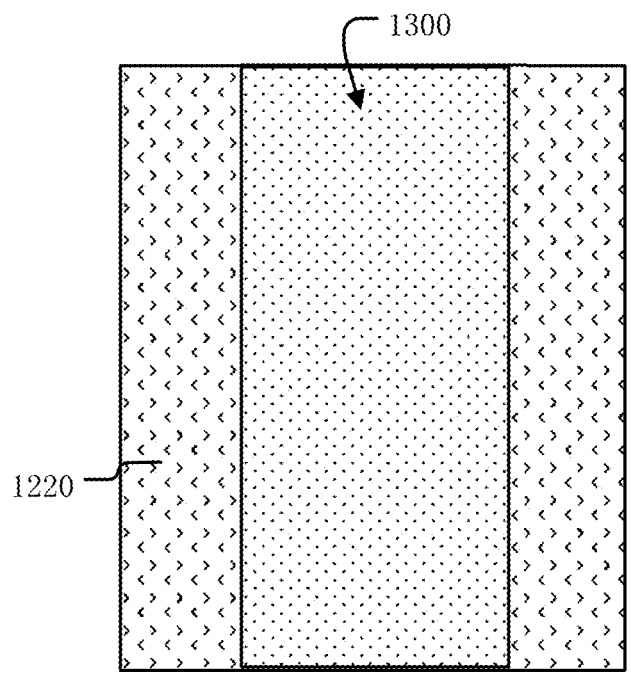
Figure 14B:
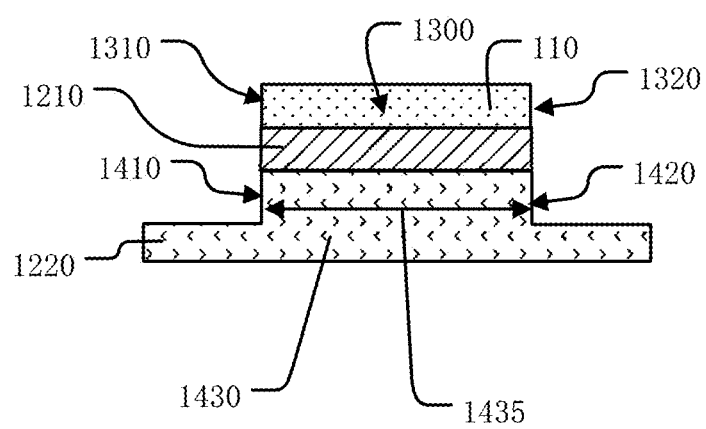

Next, an etching process is performed on the structure illustrated in FIGS. 13A and 13B using the line 1300 as etch mask, resulting in the structure illustrated in the top and cross-sectional views of FIGS. 14A and 14B.

As shown in FIGS. 14A and 14B, the etching leaves a sidewall surface 1410 in the material layer 1220 at a location defined by the sidewall surface 1310. Similarly, the etching leaves a sidewall surface 1420 in the material layer 1220 at a location defined by the sidewall surface 1320.

The sidewall surface 1410 and the sidewall surface 1420 define opposing sides of a line 1430 of material in the material layer 1220. The line 1430 has a line width 1435.

The etching process may be a two step process. In such a case, a first etch process can be performed to etch through the intermediate layer 1210 using the line 1300 as etch mask. A second etch process may then be performed using the remaining intermediate layer 1210 as an etch mask to form the line 1430 in the material layer 1220. Alternatively, the etching process may be a single etch process such as a plasma etch through the intermediate layer 1210 and into the material layer 1220.

Using the line 1300 in the material layer 110 to form the line 1430 in the material layer 1220 allows the sidewall surfaces 1310, 1320 of the line 1300 to extend along a particular plane of the crystal lattice of the material layer 110, without limiting the orientation of the sidewall surfaces 1410, 1420 of the line 1430 in the material layer 1220. In other words, the sidewall surfaces 1310, 1320 of the line 1300 may extend along a direction parallel to a particular plane of the crystal lattice of material layer 110, and the sidewall surfaces 1410, 1420 may extend along a direction parallel to a different plane of the crystal lattice of material layer 1220. This results in the line 1430 having improved line definition, while also enabling other factors such as stress effects to be taken into consideration when determining the orientation of the side surfaces 1410, 1420 of the line 1430.

Various types of integrated circuit devices, such as FinFET transistors, interconnect lines or other small features such as nano-wires, may be implemented using the line 1430. In addition, the line 1430 may be implemented as part of a mask pattern (or reticle) utlized during manufacturing of subsequent devices.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A structure comprising:
   a line of crystalline phase material having a first sidewall surface and a second sidewall surface, wherein the first sidewall surface and the second sidewall surface are parallel, the first sidewall surface and the second sidewall surface each having a line edge roughness less than or equal to 1 nm,
   the crystalline phase material having a diamond cubic structure,
   wherein the first and second sidewall surfaces extend along a direction parallel to one of a {111} plane and a {110} plane of the diamond cubic crystal structure, and a third sidewall surface extends along a direction parallel to the other of the {111} plane and the {110} plane,
   wherein a corner between the first sidewall surface and the third sidewall surface has a corner rounding radius of less than 3 nm.

2. The structure of claim 1, wherein the line of crystalline phase material has a line width roughness between the first sidewall surface and the second sidewall surface that is less than or equal to 1.5 nm.

3. The structure of claim 1, wherein the line of crystalline phase material is an etch mask overlying an intermediate layer of a material different from the line of crystalline phase material.

4. The structure of claim 3 further comprising a layer of second crystalline phase material, the intermediate layer overlying the layer of second crystalline phase material, wherein the line of crystalline phase material and the layer of second crystalline phase material have different crystal orientation.

5. The structure of claim 1 wherein the line of crystalline phase material is an etch mask overlying an etched line of an intermediate layer, the etched line of the intermediate layer overlying a layer of second crystalline phase material.

6. The structure of claim 5 wherein the line of crystalline phase material and the layer of second crystalline phase material have different crystal orientation.

7. The structure of claim 1 wherein the line has a width between the first sidewall surface and the second sidewall surface of 15 nm or less.

8. A transistor structure comprising:
   a line of semiconductor crystalline phase material, the line including a channel region of a FinFET or nanowire transistor, the line having a first sidewall surface and a second sidewall surface,
   wherein the first sidewall surface and the second sidewall surface are parallel, the first sidewall surface and the second sidewall surface each having a line edge roughness less than or equal to 1 nm,
   wherein the line has a line width roughness, being the three-sigma standard deviation of actual line width relative to mean line width between the first sidewall surface and the second sidewall surface, that is less than or equal to 1.5 nm.

9. The transistor structure of claim 8, wherein the semiconductor crystalline phase material has a diamond cubic structure.

10. The transistor structure of claim 8 wherein the line has a width between the first sidewall surface and the second sidewall surface of 15 nm or less.

\* \* \* \* \*